United States Patent [19]

Ichida

[11] Patent Number: 4,758,991
[45] Date of Patent: Jul. 19, 1988

[54] REWRITABLE SEMICONDUCTOR MEMORY DEVICE HAVING A DECODING INHIBIT FUNCTION

[75] Inventor: Kenji Ichida, Tokyo, Japan
[73] Assignee: NEC Corporation, Tokyo, Japan
[21] Appl. No.: 758,953
[22] Filed: Jul. 25, 1985
[30] Foreign Application Priority Data
  Jul. 26, 1984 [JP] Japan ................ 59-156107
[51] Int. Cl.$^4$ ........................... G11C 7/00
[52] U.S. Cl. ................... 365/195; 365/201; 365/233; 365/230; 371/21
[58] Field of Search ........... 365/201, 195, 230, 189, 365/233; 371/21

[56] References Cited

U.S. PATENT DOCUMENTS

| | | | |
|---|---|---|---|
| 4,419,747 | 12/1983 | Jordan | 365/201 |
| 4,543,647 | 9/1985 | Yoshida | 365/201 |
| 4,549,101 | 10/1985 | Sood | 365/201 |

Primary Examiner—Stuart N. Hecker
Assistant Examiner—Glenn A. Gossage
Attorney, Agent, or Firm—Burns, Doane, Swecker & Mathis

[57] ABSTRACT

A semiconductor memory device is described which includes a memory matrix made up of a plurality of memory elements which are arranged in m rows and n columns, a state setting internal signal generator controlled by state setting external signals temporarily applied to a plurality of address lines for converting a signal applied to one of the address lines into two internal signals having a phase difference of one bit period, a column selection decoder, the decoding function thereof being inhibited by a decoding inhibition signal, and a column selection decoder controller inputted with the state setting internal signals and the decoding function inhibition signal for sending a signal to the column selection decoder according to the state setting internal signals for controlling the decoding function of the column selection decoder in two modes.

4 Claims, 3 Drawing Sheets

4,758,991

REWRITABLE SEMICONDUCTOR MEMORY DEVICE HAVING A DECODING INHIBIT FUNCTION

BACKGROUND OF THE INVENTION

This invention relates to a semiconductor memory device and particularly to a rewritable semiconductor memory device having a test circuit for a reading speed.

Demand for a rewritable semiconductor memory device which has been developed as a memory device convenient for debugging the program of a microprocessor, is increasing rapidly with the increase in the number of applications of the microprocessors. Most of the presently used rewritable semiconductor memory devices utilize MOS insulated gate type field effect transistors having floating gate electrodes and their degree of integration is 2K bits at minimum and is increasing at a rate of 200% per year. Memory devices having a capacity of 64K are now being used and in the near future a capacity of 256K bits or 1 mega bits will soon be available. As the density of integration increases rapidly, an increase in the time for testing or inspection for judging whether the product is satisfactory or not presents a problem. The test made for checking whether the product is satisfactory or not at the production stage comprises two types. In one type, each memory element is written and a check is made as to whether rewriting is actually possible or not, while in the other type the read out speed is measured. Generally, the read out speed test is made after writing a specific data into a product which has been confirmed that it is rewritable. However, the time necessary for writing takes about 50 milliseconds for one word constituted by 8 bits, so that the time required for judging whether the read out time is satisfactory or not tends to increase with the density of integration thus decreasing productivity. Moreover as the read out speed test is made for specific data, the speed can be observed only when any memory element is in either a "1" or "0" state. In this manner, the content of the observed data obtained by a read out speed test of written specific data is limited and when it is desired to test all memory elements completely, the time of the read out speed test increases. In other words, the observed data is not sufficient despite the fact that the speed test takes a long time. For this reason, where sufficient data for testing all memory elements is to be collected, it would be impossible to cope with the increase in the density of integration.

SUMMARY OF THE INVENTION

It is an object of this invention to provide an improved rewritable semiconductor memory device provided with a test circuit capable of increasing the measuring speed of the read out speed of two memory states of all memory elements.

According to this invention, there is provided a rewritable semiconductor memory device comprising a memory matrix constituted by a plurality of rewritable memory elements which are arranged in m rows and n columns wherein m and n are positive integers, means for temporarily applying state setting external signals to a pair of address lines with a predetermined time interval, state setting internal signal generating means for converting the state setting external signals applied to the respective address lines into two state setting internal signals having a phase difference of one bit period, a column selection decoder whose decoding function is inhibited by a decode function inhibition signal, and a column selection decode function control means supplied with the state setting internal signals and the decode function inhibition signal for controlling the decoding function of the column selection decoder in two different modes corresponding to respective state setting internal signals such that the phase of a selection signal of the column selection decoder would be the same or opposite to that of an ordinary signal continuously inputted to one of the address lines.

BRIEF DESCRIPTION OF THE INVENTION

DESCRIPTION OF THE PREFERRED EMBODIMENT

Figure 1:
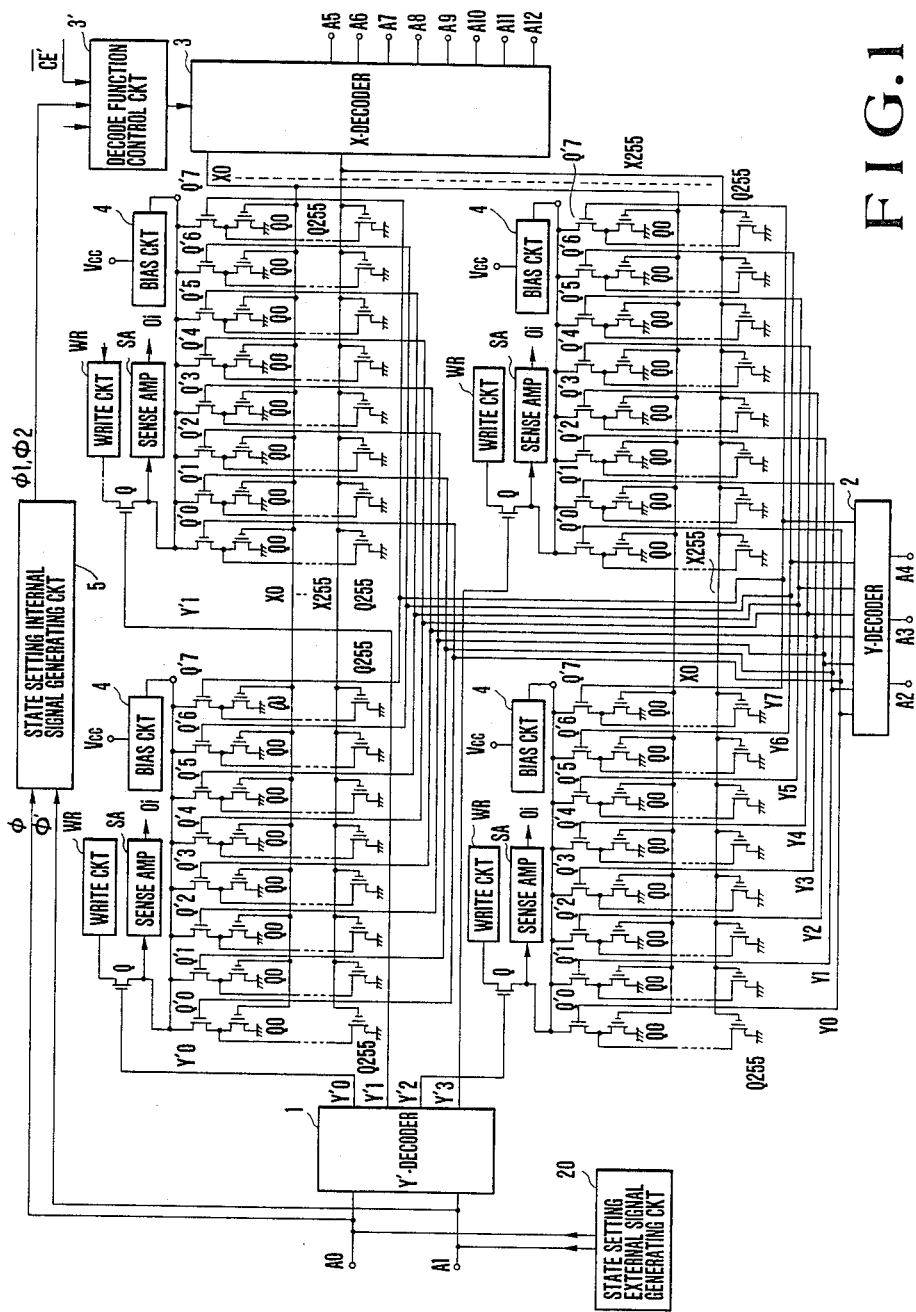
FIG. 1 is a block diagram showing one embodiment of the rewritable semiconductor memory device according to this invention.

FIG. 1 shows a preferred embodiment of the rewritable semiconductor memory device constituted by a memory matrix including 32×256 memory elements. It is assumed that the memory matrix comprises a single block. For a data of one word made up of 8 bits, a memory device having a memory capacity of 64K bits is constituted by 8 blocks. Each block is subdivided into 4 sections, and one of them is selected in accordance with selection address signals $Y'_0$ (0, 0)–$Y'_3$ (1, 1) outputted from a Y' decoder 1 in response to address signals $A_0$ and $A_1$. The memory plane of each section is constituted by 8 rows×256 columns and each column is constituted by 8 memory elements (EPROM) $Q_i$ (i=0–255) arranged in a row. After selection of an associated section, respective memory elements are sequentially selected by activating row selecting address signals $Y_0$ (0, 0, 0)–$Y_7$ (1, 1, 1) outputted from a Y decoder 2 in response to address signals $A_2$–$A_4$, and column selection address signals $X_0$ (0, 0, . . . 0)–$X_{255}$ (1, 1, . . . 1) outputted from a X decoder 3 in response to address signals $A_5$–$A_{12}$, and then data are written or read out via address drive transistors $Q'_0$–$Q'_7$.

There are also provided a bias precharging circuit 4 for supplying a bias voltage to address drive transistors $Q'_0$–$Q'_7$, a write circuit WR, a sense amplifier SA, and a source transistor Q for reading and writing. These elements are generally used for a memory device.

A state setting internal signal generating circuit 5 is coupled between address lines $A_0$ and $A_1$ and the X decoder 3. The state setting internal signal generating circuit 5 converts state setting external signals $\phi$ and $\phi'$ supplied to the address lines $A_0$ and $A_1$, from state setting external signal generating circuit 20, into two state setting internal signals $\phi1$ and $\phi2$ having a phase difference of one bit and then supplies these signals $\phi1$ and $\phi2$ to the X decoder 3.

In the circuit illustrated, the two state setting external signals $\phi$ and $\phi'$ are applied such that a high level voltage $V_H$ or a low level voltage $V_L$ is applied to the two address lines $A_0$ and $A_1$ by the state setting external signal generating circuit 20 which temporarily varies the levels. Thus the two state setting external signals $\phi$ and φ' are inputted to the state setting internal signal generating circuit 5 which continuously receives signals inputted from address lines $A_0$ and $A_1$ for producing two state setting internal signals φ1 and φ2 having a phase difference of 1 bit. For example, the state setting external signal φ inputted over address line $A_0$ produces a state setting internal signal φ1 having an opposite phase to the signal on address line $A_0$. On the other hand, the state setting external signal φ' inputted over address line $A_1$ produces a state setting internal signal φ2 having the same phase as the signal on address line $A_0$.

The decoding performance of the X decoder 3 is controlled by inputting a chip enable signal $\overline{CE}'$ and the two state setting internal signals φ1 and φ2. Additionally, the symbol $\overline{CE}'$ represents that it is active when it is at a low level. More particularly, when inputted with the state setting internal signal φ1, the state of X decoder 3 would be enabled by the low signal level "0" of the address line $A_0$, and disabled when the signal level of address line $A_0$ becomes the high level "1". In the same manner, when the state setting internal signal φ2 is applied, the state of the X decoder 3 would be enabled when the signal on the address line $A_0$ becomes the high level "1" and the decoder 3 would be disabled when the signal on the address line $A_0$ becomes the low level "0". In this manner, by shifting the input time of the state setting external signal φ with respect to the signals on the address lines $A_0$ and $A_1$, the X decoder 3 will be alternately enabled and disabled every one period of the pulse signal on the address line $A_0$. Thus, the function of the X decoder 3 is controlled by the state setting internal signals φ1 and φ2 for activating or inactivating a column selection address signal that selects a column of the memory elements. At this time, since the row selection address signal is controlled by address signals $A_2$–$A_4$ having a longer period than the signal on the address line $A_0$, two types of read out voltages, that is a high voltage (for example 5 V) and a low voltage (for example 0 V) are sequentially applied to the gate electrodes of all memory elements while a row is being selected.

Since every memory element is erased beforehand, considering the output current of the sense amplifier SA, all memory elements operate in the same manner as if the address signal changes to the low voltage from the high voltage. That is, when a memory element is selected it will output its content "1" as it is, whereas when the memory element is not selected it produces an output current corresponding to a state in which the content "0" of the memory element is preserved (written state). Thus, while maintaining all memory elements in the erased state, it is possible to equivalently measure the read out speed $T_{ACC}$ when the content of the memory element is changed from "1" to "0".

Figure 2:
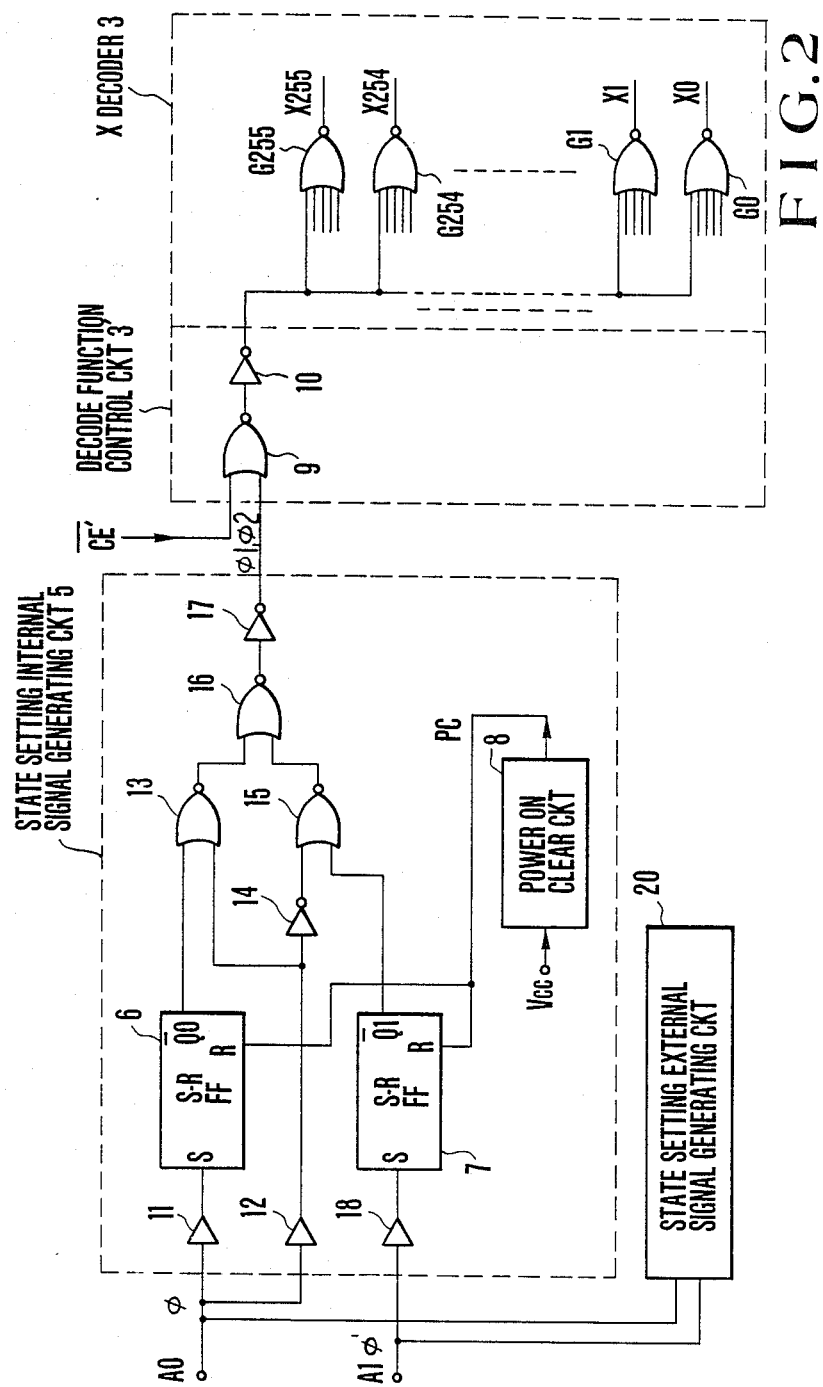
FIG. 2 is a logic circuit diagram showing one example of a decoding function control circuit shown in FIG. 1.
Figure 3:
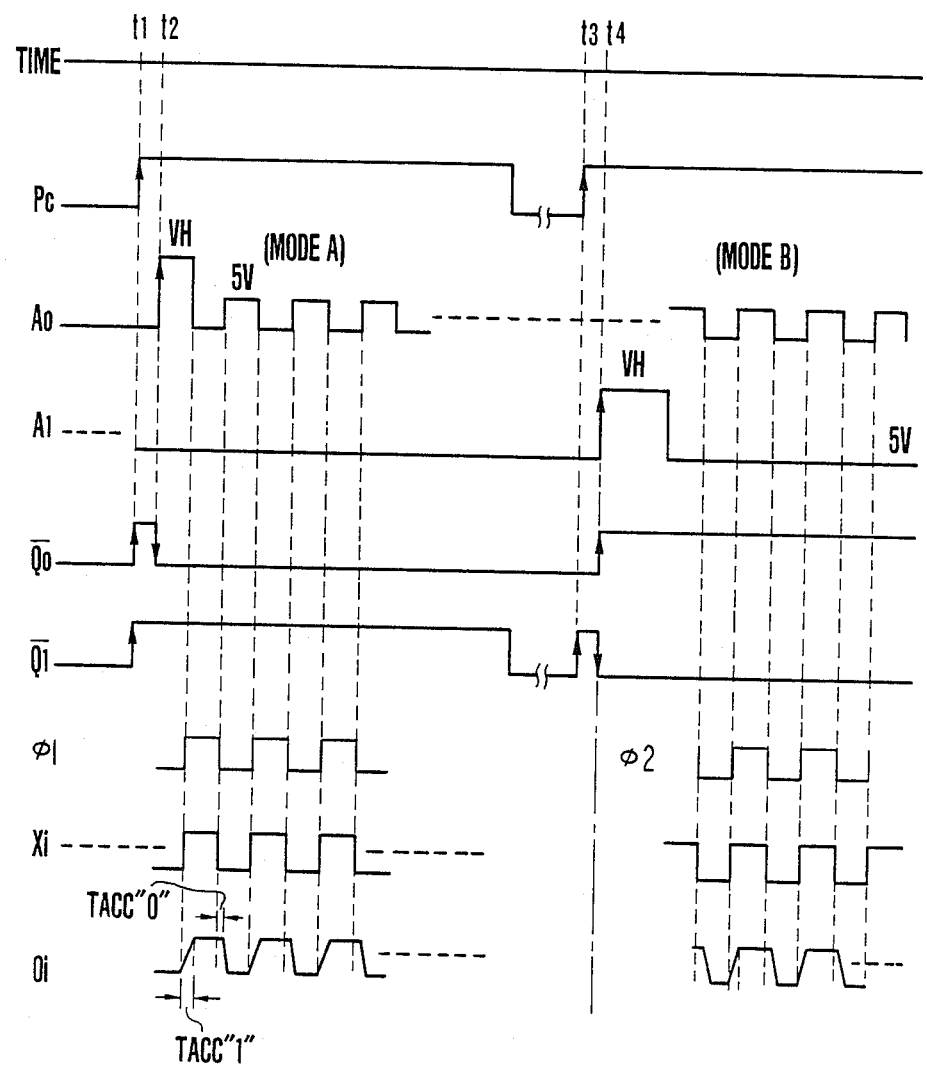
FIG. 3 is a timing chart useful to explain the operation of the decoding function control circuit.

FIG. 2 shows one embodiment of the state setting internal signal generating circuit and the decoder function control circuit 3 shown in FIG. 1 and FIG. 3 is a timing chart showing the operation of these circuits. As shown in FIG. 2, the state setting internal signal generating circuit 5 comprises S-R (Set-Reset) flip-flop circuits 6 and 7. The set input terminal S of the flip-flop circuit 6 is connected to the address line $A_0$ via an input buffer circuit 11 having a high threshold voltage, while the set input terminal S of the flip-flop circuit 7 is connected to the address line $A_1$ via a buffer 18 having a high threshold voltage. The reset input terminals R of the flip-flop circuits 6 and 7 are connected to the output terminal of a power ON clear circuit 8 which is supplied with a source voltage $V_{cc}$ to produce a drive pulse Pc.

The $\overline{Q}_0$ terminal of the flip-flop circuit 6 is connected to one input terminal of a NOR gate circuit 13. The other input terminal of NOR gate circuit 13 is connected to the output terminal of an input buffer circuit 12 having an ordinary threshold voltage. The output terminal of buffer circuit 12 is also connected to the input terminal of an inverter 14. The output terminal of inverter 14 is connected to one input terminal of a NOR gate circuit 15. The other input terminal thereof is connected to the $\overline{Q}_1$ terminal of the flip-flop circuit 7.

The outputs of NOR gate circuits 13 and 15 are applied to input terminals of a NOR gate circuit 16, the output thereof being applied to one input of a NOR gate circuit 9 via an inverter 17. The chip enable signal $\overline{CE}'$ is applied to the other input terminal of NOR gate circuit 9. The output of the NOR gate circuit 9 is commonly applied to one of the input terminals of NOR gate circuits $G_0$, $G_1$ . . . $G_{254}$, $G_{255}$ of respective columns of the X decoder 3 via an inverter 10. These NOR gate circuits $G_0$ . . . $G_{255}$ output column selection signals $X_0$, $X_1$ . . . $X_{255}$, respectively.

The operation of the circuit shown in FIG. 2 when the high level ($V_H$) state setting external signals φ and φ' are supplied to address lines $A_0$ and $A_1$ will be described with reference to FIG. 3. Thus, both flip-flop circuits 6 and 7 are reset by the drive pulse Pc from the power ON clear circuit 8 at time $t_1$ so that the outputs from $\overline{Q}_0$ and $\overline{Q}_1$ terminals are at a high level. The X decoder 3 is disabled.

At time $t_2$ the state setting external signal φ is applied to the address line $A_0$ at a high level $V_H$ of 12 V, for example, for setting the flip-flop circuit 6 through the input buffer circuit 11 having a high threshold voltage thus changing its $\overline{Q}_0$ output from high to low level at this time. Since the state of the other flip-flop circuit 7 is not changed, its $\overline{Q}_1$ output is at the high level with the result that the output of the NOR gate circuit 15 is still at the low level. Since the signal ($\overline{Q}_0$) supplied to one input terminal of NOR gate circuit 13 is at the low level, the signal continuously inputted from the address lines $A_0$ through input buffer circuit 12 is inverted by NOR gate circuit 13 and then supplied to NOR gate circuit 16. Since the signal supplied from NOR gate circuit 15 is at the low level the output of the NOR gate circuit 16 is an inversion of the output of NOR gate circuit 13. Thus, the inverter 17 produces an inverted signal of the signal on address line $A_0$, and the output of inverter 17 is supplied to one input of a NOR gate circuit 9 to act as the state setting internal signal φ1. Accordingly, a mode B control can be obtained in which the X decoder 3 is enabled when the signal on the address line $A_0$ is at the high level "1" and the operation of the X decoder 3 is disabled when the signal on the address line $A_0$ becomes the low level "0". A similar function is also effected when a state setting external signal φ' is applied to address line $A_1$. In this case, at time $t_4$ the $\overline{Q}_1$ output of the flip-flop circuit 7 is changed from high to low level through input buffer circuit 18 having a high threshold voltage. At this time, the $\overline{Q}_0$ output of the flip-flop circuit 6 maintains the high level, and the ouput of the NOR gate circuit 13 maintains the low level. The output of the NOR gate circuit 15 is at the same phase as the signal on the address line $A_0$ which is continuously supplied to one input terminal of the NOR gate circuit 15 via the input buffer circuit 12. Since the output of NOR gate circuit 16 has an opposite phase to the output of NOR gate circuit 15, the inverter 17 produces an output of the same phase as the signal on the address line $A_0$. As a consequence, the state setting internal signal $\phi 2$ is applied to one input of the NOR gate circuit 9 thus obtaining a mode A control.

The two control modes A and B are obtained while the row selection of the memory elements is being made. The read out speed $T_{ACC}$"0" and $T_{ACC}$"1" at the time of changing the memory content from "1" to "0" and vice versa can be measured from the output current waveform.

When the high threshold level signal is applied to address lines A0 and A1 in order to activate the state setting internal signal generator circuit 5, the Y' decoder is also activated simultaneously as it is connected to the address lines A0 and A1. As a result, the transistors, Q, which connect the write circuits, WR, and the address drive transistors (switching transistors) Q0'-Q7' are turned on. At this time, an unexpected undesired writing operation is prevented from being carried out by inhibiting the write circuit, WR.

As above described, while maintaining all memory elements in a memory plane in the erased state or "1" state the read out speed corresponding to the different memory state "0" can also be equivalently measured. To erase all memory elements it is only necessary to irradiate them with ultraviolet rays for about 30 minutes. This irradiation can be made according to a batch processing in which several elements are grouped. Accordingly, the test can be made in much shorter time than a time necessary for writing a specific data as in the prior art. In a case where all memory elements can have two different memory states without changing their contents, as it is possible to quickly measure two read out speeds, the prior art problem of insufficient observed data can be solved and the time of testing can be greatly reduced. Consequently, even when the density of integration increases with year, increase in the test time of semiconductor memory devices including high density integrated circuit does not present a problem.

What is claimed is:

1. A semiconductor memory device comprising:
   a memory matrix constituted by a plurality of rewritable memory elements which are arranged in m rows and n columns wherein m and n are positive integers, each of said memory elements being selected by a selection signal in accordance with signals on address lines associated with said memory matrix;
   means for temporarily applying state setting external signals to a plurality of said address lines with a predetermined time interval;
   state setting internal signal generating means for converting said state setting external signals applied to respective address lines into a selected one of a first state setting internal signal and a second state setting internal signal, corresponding to first and second modes, said first state setting internal signal having a different phase from said second state setting internal signal;
   a column selection decoder controlled by a chip enable signal for producing the selection signal; and
   a column selection decoding function control means supplied with the selected one of said first and second state setting internal signals and said chip enable signal for controlling the decoding function of said column selection decoder such that said column selection decoder generates the selection signal when the selected one of said first and second state setting internal signals has a first logical level and does not generate the selection signal when the selected one of said first and second state setting internal signals has a second logical level.

2. The semiconductor memory device according to claim 1 wherein said state setting internal signal generating means comprises first and second set-reset type flip-flop circuits having set input terminals respectively connected to said address lines through input buffer circuits having high threshold values;
   circuit means for supplying a common reset signal to reset input terminals of said flip-flop circuits;
   first and second NOR gate circuits having one input terminal respectively connected to receive Q outputs of said flip-flop circuits;
   an input buffer circuit having an ordinary threshold value and connected between one of said address lines and a second input terminal of said first NOR gate circuit;
   an inverter connected between an output terminal of said ordinary threshold value input buffer circuit and a second input terminal of said second NOR gate circuit;
   a third NOR gate circuit receiving the outputs of said first and second NOR gate circuits; and
   an inverter for inverting an output signal of said third NOR gate circuit.

3. The semiconductor memory device according to claim 1 wherein said column selection decoding function control means comprises a NOR gate circuit which receives said chip enable signal and one of said first and second state setting internal signals, and an inverter for inverting an output of said NOR gate circuit and for supplying the output of said inverter to said column selection decoder.

4. A semiconductor memory device comprising:
   a memory matrix constituted by a plurality of rewritable memory elements which are arranged in m rows and n columns wherein m and n are positive integers;
   means for temporarily applying state setting external signals to a pair of address lines with a predetermined time interval;
   state setting internal signal generating means for converting said state setting external signals applied to respective address lines into a selected one of a first state setting internal signal and a second state setting internal signal, corresponding to first and second modes, said first state setting internal signal having a different phase from said second state setting internal signal, said state setting internal signal generating means comprising first and second set-reset type flip-flop circuits having set input terminals respectively connected to said address lines through input buffer circuits having high threshold values, circuit means for supplying a common reset signal to reset input terminals of said flip-flop circuits, first and second NOR gate circuits having one input terminal connected to receive Q outputs of said flip-flop circuits, an input buffer circuit having an ordinary threshold value and connected between one of said address lines and a second input terminal of said first NOR gate circuit, an inverter connected between an output terminal of said ordinary threshold value input buffer circuit and a second input terminal of said second NOR gate circuit, a third NOR gate circuit receiving outputs of said first and second NOR gate circuits, and an inverter for inverting an output signal of said third NOR gate circuit;

a column selection decoder controlled by a chip enable signal for producing the selection signal; and a column selection decoding function control means supplied with one of said first and second state setting internal signals and said chip enable signal for controlling the decoding function of said column selection decoder in said first and second modes such that said column selection decoder generates the selection signal having a same phase as that of the state setting external signal supplied to one of said address lines when said first state setting internal signal is supplied thereto, and generates the selection signal having an opposite phase to that of the state setting external signal supplied to one of said address lines when said second state setting internal signal is supplied thereto.

* * * * *